United States Patent
Fortunato et al.

(10) Patent No.: US 12,531,717 B2
(45) Date of Patent: Jan. 20, 2026

(54) PHASE-LOCKED LOOP CIRCUIT AND CORRESPONDING METHOD OF OPERATION

(71) Applicant: STMicroelectronics International N.V., Geneva (CH)

(72) Inventors: Davide Nicolo Fortunato, Palermo (IT); Antonino Calcagno, Messina (IT); Gaetano Cosentino, Catania (IT); Marco Vinciguerra, Catania (IT)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 18/793,128

(22) Filed: Aug. 2, 2024

(65) Prior Publication Data

US 2025/0088343 A1    Mar. 13, 2025

(30) Foreign Application Priority Data

Sep. 12, 2023  (IT) .................... 102023000018714

(51) Int. Cl.
  *H04L 7/033*  (2006.01)
(52) U.S. Cl.
  CPC ................. *H04L 7/033* (2013.01)
(58) Field of Classification Search
  CPC .......... H04L 7/033; H03L 7/089; H03L 7/093
  See application file for complete search history.

(56) References Cited

U.S. PATENT DOCUMENTS

| | | |
|---|---|---|
| 5,355,098 A | 10/1994 | Iwasaki |
| 5,831,482 A | 11/1998 | Salvi et al. |
| 11,356,058 B1 * | 6/2022 | Huang ..................... H03B 5/04 |
| 2006/0028283 A1 * | 2/2006 | Sze ........................ H03B 5/1265 331/16 |
| 2011/0128080 A1 * | 6/2011 | Wennekers ............ H03B 5/1243 331/34 |
| 2012/0019327 A1 * | 1/2012 | Romano .................. H03L 7/12 331/34 |

FOREIGN PATENT DOCUMENTS

| | | |
|---|---|---|
| EP | 2187523 A1 | 5/2010 |
| WO | 2009118587 A1 | 10/2009 |

OTHER PUBLICATIONS

Stmicroelectronics N.V., "Written Opinion and Search Report", Italian Application No. 10202300018714, dated Mar. 20, 2023, 9 pages.

* cited by examiner

Primary Examiner — Freshteh N Aghdam
(74) Attorney, Agent, or Firm — Slater Matsil LLP (57) ABSTRACT

In a PLL, a VCO is controlled by a control voltage and produces an output periodic signal. A comparator compares the control voltage to a comparison signal, and asserts/deasserts a detection signal if the control voltage is higher/lower than the comparison signal. A digital logic circuit receives the detection signal, produces the comparison signal, and produces a compensation signal to control the VCO. During a VCO compensation procedure first phase, the digital logic circuit determines and stores a value of the comparison signal that corresponds to a current value of the control voltage, and compares the stored value of the comparison signal to a target value to determine whether the control voltage needs to be increased or decreased. During a VCO compensation procedure second phase, the digital logic circuit iteratively changes the value of the compensation signal until the control voltage reaches a desired value.

20 Claims, 3 Drawing Sheets

PHASE-LOCKED LOOP CIRCUIT AND CORRESPONDING METHOD OF OPERATION

CROSS-REFERENCE TO RELATED APPLICATIONS

This application is a translation of and claims the priority benefit of Italian Application No. 102023000018714, filed on Sep. 12, 2023, entitled "Phase-locked loop circuit and corresponding method of operation," which is hereby incorporated herein by reference to the maximum extent allowable by law.

TECHNICAL FIELD

The description relates to phase-locked loop (PLL) circuits and corresponding methods of operation. Such PLL circuits may be applied, for instance, to digital radios.

BACKGROUND

A phase-locked loop is a control system that generates an output periodic signal whose phase is related to the phase of an input (reference) periodic signal. A conventional PLL circuit consists of a voltage-controlled oscillator (VCO) and a phase detector (PD) arranged in a feedback loop. The oscillator generates the output signal at a specific frequency, and the phase detector compares the phase of the output signal to the phase of the input (reference) signal, to adjust the oscillator to keep the phases matched.

Figure 1:
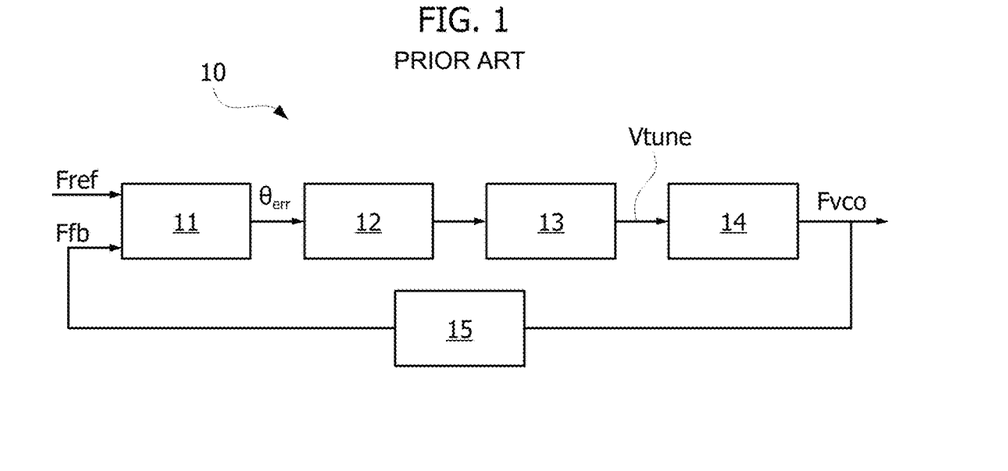
FIG. 1 is a circuit block diagram exemplary of a CP-PLL circuit.

FIG. 1 is a circuit block diagram exemplary of a conventional charge-pump phase-locked loop (CP-PLL) circuit 10. The CP-PLL circuit 10 includes a phase frequency detector circuit 11 (PFD) configured to receive a reference periodic signal Fref (e.g., produced by a local oscillator) and a feedback signal Ffb produced as a function of the output signal Fvco of the PLL circuit 10. Signal Fref has a reference frequency $f_{ref}$ and signal Ffb has a frequency $f_{fb}$. The PFD circuit 11 compares signals Fref and Ffb to produce a phase error signal $\theta_{err}$ indicative of the phase error between signals Fref and Ffb (e.g., $\theta_{err}$ being positive if the reference signal Fref trails the feedback signal Ffb, and negative if the reference signal Fref lags the feedback signal Ffb). The PLL circuit 10 includes a charge pump circuit 12 (CP) that receives the phase error signal $\theta_{err}$ and produces positive or negative current pulses depending on the phase error signal $\theta_{err}$ (e.g., positive current pulses if the phase error signal $\theta_{err}$ is positive, and negative current pulses if the phase error signal $\theta_{err}$ is negative). The PLL circuit 10 includes a low-pass filter circuit 13 (LPF) that receives the current pulses from the CP circuit 12 and transforms the current pulses in a control voltage signal Vtune. The LPF circuit 13 additionally filters spurious frequencies of the feedback signal Ffb that are multiple of the reference frequency $f_{ref}$. The PLL circuit 10 includes a voltage-controlled oscillator circuit 14 (VCO) that receives the control voltage signal Vtune and produces the output periodic signal Fvco of the PLL circuit 10 at the desired frequency $f_{vco}$, as a function of the control voltage signal Vtune. The PLL circuit 10 includes a frequency divider circuit 15 (e.g., an integer or fractional divider) that receives the output signal Fvco and produces the feedback signal Ffb by dividing the frequency of signal Fvco. In some cases, the dividing factor may be unitary, so that $f_{fb}=f_{vco}$ (e.g., the divider circuit 15 may be absent from the architecture).

Conventionally, during the design of a PLL circuit, the value of the control voltage Vtune is selected to be constant (e.g., about 0.42 V) so that the gain $K_{VCO}$ of the VCO circuit 14, the current output by the charge pump circuit 12, the sizing of the low-pass filter circuit 13, as well as the target voltage and target frequency of the output signal Fvco can be optimized.

Figure 2:
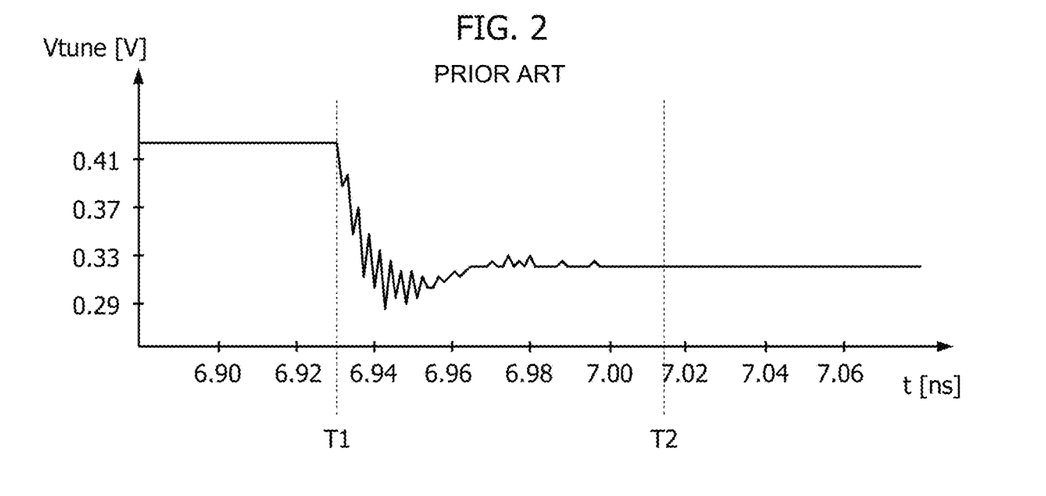
FIG. 2 is a waveform exemplary of a possible variation of the control voltage signal of a VCO circuit in a PLL circuit in response to an (impulsive) temperature variation.
Figure 3:
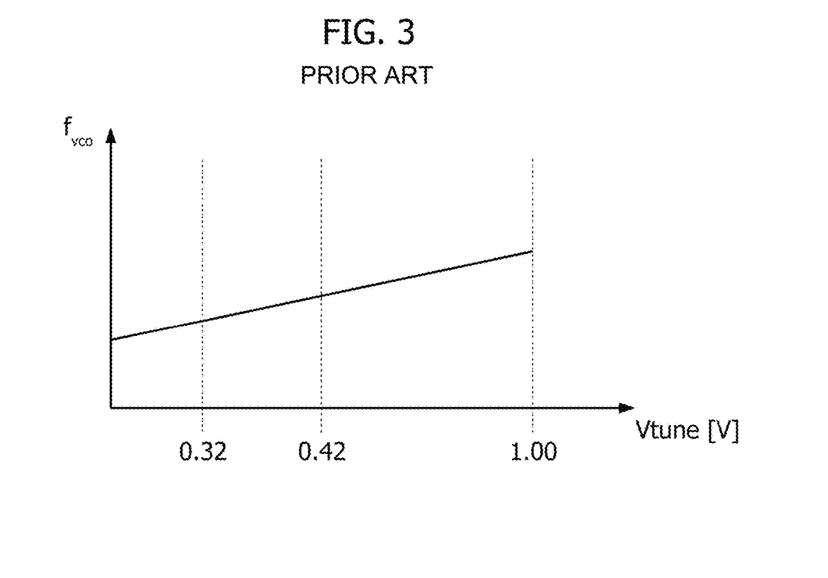
FIG. 3 is a diagram exemplary of a possible (linear) relationship between the value of the control voltage signal of the VCO circuit of a PLL circuit and the frequency of the output signal of the PLL circuit.

However, during operation of the PLL circuit, the value of the control voltage Vtune may change due to various phenomena, such as temperature variations, device degradation (e.g., aging), variations of the supply voltage of the VCO circuit, and the like. For instance, FIG. 2 illustrates a waveform of the control voltage Vtune that is initially set to about 0.42 V, and changes value at a certain instant T1 when a temperature variation takes place. After a settling time, the control voltage Vtune stabilizes at a new value (e.g., about 0.32 V at instant T2). Therefore, the PLL circuit 10 operates at a different working point after the temperature variation. As a result, the frequency $f_{vco}$ of the output signal Fvco may vary, since it depends on the value of the control voltage Vtune. For instance, FIG. 3 illustrates a relationship between the frequency $f_{vco}$ and the control voltage Vtune, and shows that the frequency $f_{vco}$ may be linearly dependent on the control voltage Vtune, so that a decrease of the control voltage Vtune results in a decrease of the frequency $f_{vco}$.

In some known solutions, since the variations of the control voltage Vtune may be due to temperature variations, temperature sensors are used to sense the temperature of the PLL circuit and adjust (e.g., compensate) the control voltage Vtune as a function of the sensed temperature. However, these solutions require the implementation of a temperature sensor and the calibration of the temperature sensor, and furthermore are affected by the sensor accuracy and the measurement error.

Other known solutions compensate the variations of the control voltage Vtune acting on the VCO circuit, in particular using control words that allow to change the capacitances of the VCO circuit (e.g., choosing among different capacitors in an array of capacitors, or using a variable capacitor or varactor) to reach the specification value.

Therefore, there is a need in the art to provide improved PLL circuits that facilitate compensating unwanted variations of the VCO control voltage Vtune.

SUMMARY

An object of one or more embodiments is to contribute in providing such improved PLL circuits that can compensate unwanted variations of the VCO control voltage.

According to one or more embodiments, such an object can be achieved by a phase-locked loop circuit having the features set forth in the claims that follow.

One or more embodiments may relate to a corresponding method of operation.

The claims are an integral part of the technical teaching provided herein in respect of the embodiments.

According to an aspect of the present description, a PLL circuit includes a VCO circuit controlled by a control voltage and configured to produce an output periodic signal. The PLL circuit further includes a comparator circuit configured to compare the control voltage to a comparison signal, assert a detection signal in response to the control voltage being higher than the comparison signal, and de-assert the detection signal in response to the control voltage being lower than the comparison signal. The PLL circuit further includes a digital logic circuit configured to receive the detection signal and produce the comparison signal and produce a compensation signal for controlling operation of the VCO circuit. The digital logic circuit is further configured to:

during a first phase of a VCO compensation procedure, determine and store a value of the comparison signal that corresponds to a current value of the control voltage, and compare the stored value of the comparison signal to a target value to determine whether the control voltage needs to be increased or decreased; and during a second phase of the VCO compensation procedure, iteratively change the value of the compensation signal until the control voltage reaches a desired value.

One or more embodiments thus provide a PLL circuit able to compensate unwanted variations of the VCO control voltage in a simple manner, independently from the cause of such variation, and without the need of implementing a dedicated temperature sensor.

According to another aspect of the present description, a method of operating a PLL circuit according to one or more embodiments includes:

comparing, at the comparator circuit, the control voltage to a comparison signal, asserting a detection signal in response to the control voltage being higher than the comparison signal, and de-asserting the detection signal in response to the control voltage being lower than the comparison signal;

receiving the detection signal at the digital logic circuit, and producing the comparison signal and producing the compensation signal for controlling operation of the VCO circuit at the digital logic circuit;

during a first phase of a VCO compensation procedure, determining and storing by the digital logic circuit a value of the comparison signal that corresponds to a current value of the control voltage, and comparing by the digital logic circuit the stored value of the comparison signal to a target value to determine whether the control voltage needs to be increased or decreased; and during a second phase of the VCO compensation procedure, iteratively changing by the digital logic circuit the value of the compensation signal until the control voltage reaches a desired value.

BRIEF DESCRIPTION OF THE DRAWINGS

One or more embodiments will now be described, by way of example, with reference to the annexed figures, wherein.

DETAILED DESCRIPTION OF EXEMPLARY EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is included in at least one embodiment. Hence, phrases such as "in an embodiment" or "in one embodiment" that may be present in one or more points of the present description do not necessarily refer to one and the same embodiment. Moreover, particular configurations, structures, or characteristics may be combined in any adequate way in one or more embodiments.

The headings/references used herein are provided merely for convenience and hence do not define the extent of protection or the scope of the embodiments.

Throughout the figures annexed herein, unless the context indicates otherwise, like parts or elements are indicated with like references/numerals and a corresponding description will not be repeated for the sake of brevity.

One or more embodiments relate to a PLL circuit (e.g., a CP-PLL circuit) having an improved capability of compensating unwanted variations of the control voltage Vtune that drives operation of the VCO circuit. In particular, it is provided a PLL circuit that includes a digital logic circuit that implements a finite state machine (FSM). The FSM operates to detect variations of the control voltage Vtune (independently from their cause, i.e., not only due to temperature variations), and to compensate such variations so that the frequency of the output signal of the VCO circuit is not affected thereby.

Figure 4:
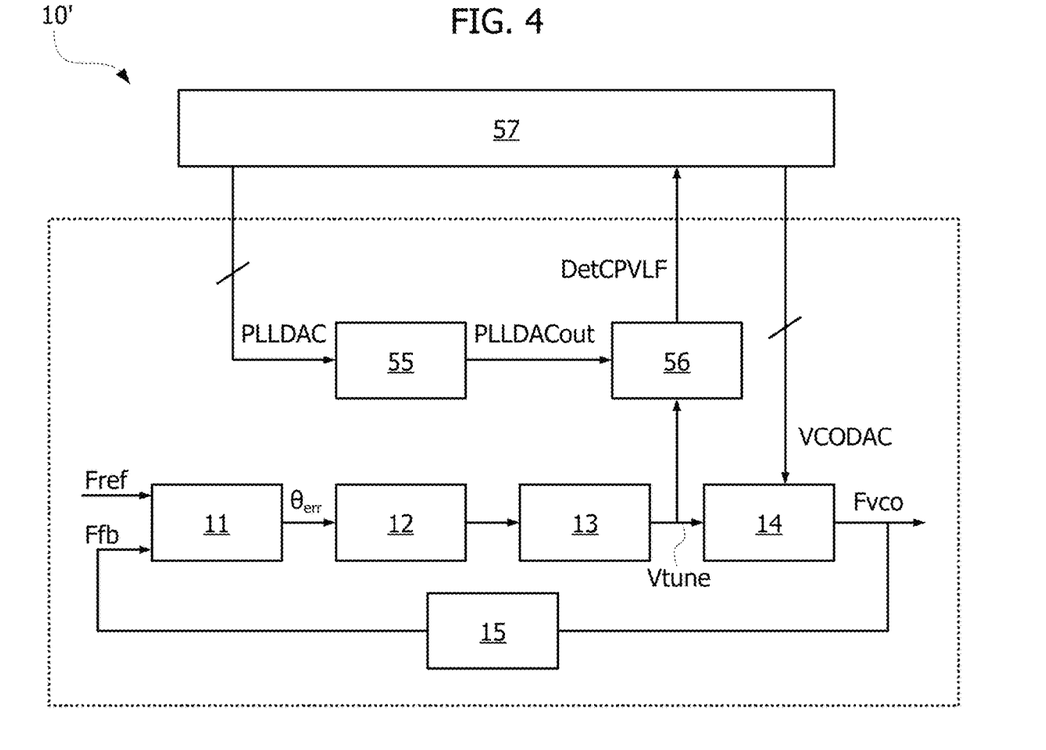
FIG. 4 is a circuit block diagram exemplary of a PLL circuit according to one or more embodiments of the present description.

In detail, FIG. 4 is a circuit block diagram exemplary of a charge-pump phase-locked loop (CP-PLL) circuit 10' according to one or more embodiments. The PLL circuit 10' may include one or more of the functional blocks of a conventional PLL circuit, e.g., circuit blocks 11, 12, 13, 14 and 15 as described with reference to FIG. 1. It will otherwise be appreciated that one or more embodiments as disclosed herein may be applied to any type of PLL circuit (e.g., not necessarily a CP-PLL circuit), insofar as the compensation architecture is configured to sense the (e.g., analog) control voltage Vtune and produce, as a function thereof, a (e.g., digital) compensation signal VCODAC that is received by the VCO circuit 14.

As exemplified in FIG. 4, the PLL circuit 10' includes a comparator circuit 56 configured to compare the control voltage Vtune to a comparison signal PLLDACout and generate a detection signal DetCPVLF as a function of such a comparison. Comparator 56 is preferably an analog comparator (i.e., comparing analog signals Vtune and PLLDACout and producing a digital signal DetCPVLF). For instance, the detection signal DetCPVLF may be asserted (e.g., set to a high logic value, '1') if Vtune≥PLLDACout, and may be de-asserted (e.g., set to a low logic value, '0') if Vtune<PLLDACout, as indicated in the following:

$$DetCPVLF = \begin{cases} 1 & \text{if } Vtune \geq PLLDACout \\ 0 & \text{if } Vtune < PLLDACout \end{cases}$$

As exemplified in FIG. 4, the PLL circuit 10' includes a digital logic circuit 57 that receives the detection signal DetCPVLF and produces, as a function thereof, the (e.g., digital) compensation signal VCODAC (e.g., an M-bit digital signal, such as a 9-bit signal) that is received by the VCO circuit 14. As discussed in more detail in the following, the logic circuit 57 increases or decreases the value of signal VCODAC, which in turn affects operation of the VCO circuit 14, in order to pursue (e.g., track) the expected value of the control voltage Vtune. The logic circuit 57 produces as well a (e.g., digital) comparison signal PLLDAC (e.g., an N-bit digital signal, such as a 9-bit signal), as discussed in more detail in the following.

As exemplified in FIG. 4, the PLL circuit 10' includes a digital-to-analog converter circuit 55 (DAC) that receives the digital comparison signal PLLDAC and converts it into the corresponding analog comparison signal PLLDACout previously mentioned.

In one or more embodiments, the architecture of FIG. 4 may be slightly modified according to different implementations. For instance, at least two options are available for controlling operation of the VCO circuit 14 via the compensation signal VCODAC: signal VCODAC may drive a varactor of the VCO circuit 14, and/or signal VCODAC may drive a bank of capacitors (i.e., an array of small capacitors, which allows fine frequency tuning). For instance, the digital word VCODAC is converted into a corresponding analog voltage by a digital-to-analog converter, and such an analog voltage drives a varactor of the VCO circuit 14. Another possible change relates to the comparison of the analog control voltage Vtune: instead of using a DAC circuit 55 to convert the digital comparison signal PLLDAC into an analog comparison signal PLLDACout and carrying out a comparison of analog signals at comparator 56, it may be possible to use an ADC circuit (not visible in FIG. 4) to convert the analog control signal Vtune into a digital control signal, and then carrying out a comparison of digital signals at comparator 56 (i.e., comparing the digital replica of Vtune directly to the digital comparison signal PLLDAC, without implementing the DAC circuit 55). However, embodiments using a DAC circuit 55 and relying on comparison of analog signals may be more advantageous, insofar as a DAC circuit 55 has smaller area, lower power consumption and less noise compared to an ADC circuit.

Figure 5:
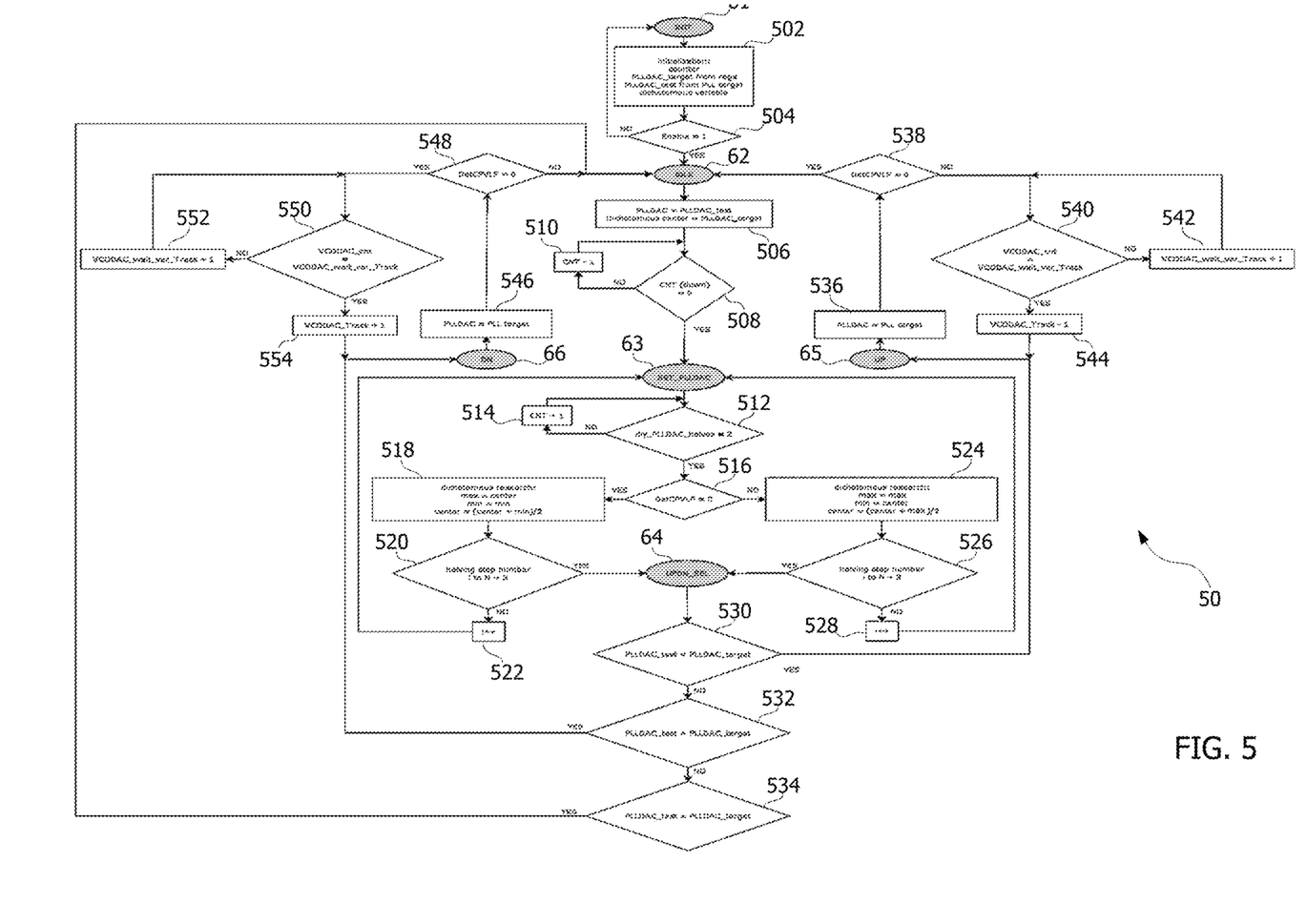
FIG. 5 is a state diagram exemplary of operation of a finite state machine (FSM) in a PLL circuit according to one or more embodiments of the present description.

In one or more embodiments, an FSM 50 implemented by logic circuit 57 may include six states, as exemplified by the block diagram of FIG. 5, which shows the FSM states (represented by ellipses) and their transitions. A first state 61 (also referred to as INIT state) may be used for initialization of the FSM variables. A second state 62 (also referred to as IDLE state) may be used for waiting between one check and another (e.g., waiting between two consecutive compensations of signal Vtune); the waiting time may be programmable. A third state 63 (also referred to as SET_PLLDAC state) may be used for carrying out a search (e.g., dichotomic search) of the value of signal PLLDAC corresponding to the current value of signal Vtune. A fourth state 64 (also referred to as UPDN_SEL state) may be used for the routing to an UP state (to increase Vtune, i.e., to compensate for an unwanted decrease of Vtune) or to a DN state (to decrease Vtune, i.e., to compensate for an unwanted increase of Vtune). A fifth state 65 (also referred to as UP state) may be used to increase the control signal Vtune, decreasing the compensation signal VCODAC. A sixth state 66 (also referred to as DN state) may be used to decrease the control signal Vtune, increasing the compensation signal VCODAC.

Substantially, operation of the FSM 50 includes a first "search" phase, up to the UPDN_SEL state 64, during which the digital value of signal PLLDAC that corresponds to the current value of the control voltage Vtune is determined and then compared to a digital target value to define whether the control voltage Vtune has to be increased or decreased to meet the analog target value, and a second "compensation" phase, including the UP and DN states 65 and 66, during which the compensation signal VCODAC is iteratively changed to compensate the undesired variation of signal Vtune until the value of signal Vtune meets the target value. During the search phase, signal PLLDAC is assigned the value of a variable PLLDAC_test which is iteratively updated and signal DetCPVLF is used as an indicator for the execution of the (e.g., dichotomic) search, while during the compensation phase, signal PLLDAC is assigned the constant value of a variable PLLDAC_target and signal DetCPVLF is used as an indicator for stopping execution of the compensation.

Detailed operation of the FSM 50 according to the block diagram of FIG. 5 will now be described.

The FSM starts in the INIT state 61. In this state the FSM variables are initialized, as exemplified by the block of operations 502. The initialized variables include one or more of the following:

one or more counters that are used to implement respective timers, as described in detail in the following, in particular: a first counter CNT_idle that is initialized to a value wait_time_track (e.g., a programmable value); a second counter CNT_halving that is initialized to zero; a third counter CNT_compare that is initialized to zero;

a variable PLLDAC_target, whose value (which remains constant during execution of the whole algorithm of FIG. 5) is initialized from an internal register of the FSM 50, and represents the digital (e.g., 9-bit) value of signal PLLDAC that corresponds to the analog target value of the control voltage Vtune (or desired Vtune), according to the following equation:

$$\text{desired } vtune = \frac{\text{PLLDAC\_target}}{2^N - 1} * V_{tune\_MAX}$$

where N is the number of bits of signal PLLDAC and $V_{tune\_MAX}$ is the maximum value of signal Vtune (e.g., about 1.1 V);

a variable PLLDAC_test, which will be updated iteratively during the search operating phase of the FSM 50 and represents the value of signal PLLDAC that corresponds to the current value of the control voltage Vtune, and is initialized with the same value as PLLDAC_target;

the variables MIN (minimum), MAX (maximum) and CENTER (center) for a dichotomic search (in particular, a binary search) that the FSM will carry out to iteratively refine the value of variable PLLDAC_test, where possible initialization values are MIN=0, MAX=$2^N$−1 (e.g., MAX=511 if signal PLLDAC is a 9-bit signal), and CENTER=($2^N$−1)/2 (e.g., CENTER=255 if signal PLLDAC is a 9-bit signal).

At step 504, the FSM 50 checks whether execution of the compensation algorithm is enabled by checking whether an enable signal EN is asserted (e.g., '1') or not (e.g., '0'). In response to a negative outcome (N) of step 504, the FSM 50 remains in the INIT state 61. In response to a positive outcome (Y) of step 504, the FSM 50 transitions to the IDLE state 62.

In the IDLE state 62, as exemplified by the block of operations 506, the digital comparison signal PLLDAC is assigned the value of variable PLLDAC_test, and the value of variable CENTER (the dichotomic center) is set to the value of variable PLLDAC_target. After the operations of block 506, the FSM may wait for a certain time interval, as exemplified by the blocks of operations 508 and 510 that substantially implement a timer. In fact, step 508 includes checking whether the first counter CNT_idle (previously initialized at value wait_time_track) is equal to zero. In response to a negative outcome (N) of step 508, the counter CNT_idle is decremented at step 510 (e.g., by one unit). In response to a positive outcome (Y) of step 508, the FSM 50 transitions to the SET_PLLDAC state 63. Therefore, substantially, the operations of blocks 508 and 510 provide a timer that pauses the FSM for a number of clock cycles equal to wait_time_track between the initialization and the start of the (e.g., dichotomic) search of the value of signal PLLDAC.

In the SET_PLLDAC state 63, as exemplified by the blocks of operations 512 to 528, the FSM 50 carries out an iterative search (e.g., a dichotomic search, in particular a binary search) to determine the value of the variable PLLDAC_test that, when assigned to the digital comparison signal PLLDAC, results in an analog comparison signal PLLDACout having a value corresponding to the current value of the control voltage Vtune (e.g., "equal" to Vtune but considering the quantization error). After entering the SET_PLLDAC state 63, the FSM waits for a certain time interval, as exemplified by the blocks of operations 512 and 514 which substantially implement a timer. In fact, step 512 includes checking whether the second counter CNT_halving (previously initialized at zero) is equal to a certain threshold dly_PLLDAC_halves, e.g., equal to 2. In response to a negative outcome (N) of step 512, the counter CNT_halving is incremented at step 514 (e.g., by one unit). In response to a positive outcome (Y) of step 512, the FSM 50 transitions to step 516. Therefore, substantially, the operations of blocks 512 and 514 provide a timer that pauses the FSM for a number of clock cycles equal to dly_PLLDAC_halves between two consecutive halving steps of the dichotomic search algorithm.

At step 516, the FSM checks whether the detection signal DetCPVLF is equal to zero. A positive outcome (Y) of step 516 indicates that the current value of variable PLLDAC_test assigned to signal PLLDAC produces signal PLLDACout so that Vtune<PLLDACout, and thus that the search algorithm searches in the lower half of the array, which is exemplified by steps 518, 520 and 522. A negative outcome (N) of step 516 indicates that the current value of variable PLLDAC_test assigned to signal PLLDAC produces signal PLLDACout so that Vtune≥PLLDACout, and thus that the binary search algorithm searches in the upper half of the array, which is exemplified by steps 524, 526 and 528.

At step 518, the dichotomic variables are updated as follows: $MAX_{i+1}=CENTER_i$, $MIN_{i+1}=MIN_i$, and $CENTER_{i+1}=(CENTER_i+MIN_i)/2$, where the subscript indicates the number of iteration of the search algorithm. Variable PLLDAC_test is assigned the center value $CENTER_{i+1}$. At step 520, it is checked whether the current iteration counter i of the binary search algorithm is higher than a certain threshold, where the threshold is higher than N (N being the number of bits of signal PLLDAC). For instance, it is checked whether i is equal to N+3. A positive outcome (Y) of step 520 indicates that the binary search algorithm is concluded, while a negative outcome (N) of step 520 indicates that the binary search algorithm may still be running. Therefore, in response to a positive outcome (Y) of step 520, the FSM 50 transitions to the UPDN_SEL state 64. In response to a negative outcome (N) of step 520, the iteration counter i is incremented (e.g., by one unit) at step 522 and the FSM 50 transitions to state 63 for a further iteration of the search algorithm, with signal PLLDAC now being assigned an updated value of the variable PLLDAC_test.

Steps 524, 526 and 528 are the same as steps 518, 520 and 522 but in case the binary search algorithm has to search in the upper half of the array. At step 524, the dichotomic variables are updated as follows: $MAX_{i+1}=MAX_i$, $MIN_{i+1}=CENTER_i$, and $CENTER_{i+1}=(CENTER_i+MAX_i)/2$, where the subscript indicates the number of iteration of the search algorithm. Variable PLLDAC_test is assigned the center value $CENTER_{i+1}$. At step 526, it is checked whether the current iteration counter i of the search algorithm is higher than a certain threshold, where the threshold is higher than N. For instance, it is checked whether i is equal to N+3. A positive outcome (Y) of step 526 indicates that the binary search algorithm is concluded, while a negative outcome (N) of step 526 indicates that the binary search algorithm may still be running. Therefore, in response to a positive outcome (Y) of step 526, the FSM 50 transitions to the UPDN_SEL state 64. In response to a negative outcome (N) of step 526, the iteration counter i is incremented (e.g., by one unit) at step 528 and the FSM 50 transitions to state 63 for a further iteration of the search algorithm, with signal PLLDAC now being assigned an updated value of the variable PLLDAC_test.

It is noted that a dichotomic search algorithm would find the correct value of variable PLLDAC_test after N iterations at most, so that in one or more embodiments the steps 520 and 526 may compare the iteration counter i to a threshold different from N+3, e.g., any threshold higher than N. However, a certain margin provides higher reliability. In other embodiments, the search algorithm may even be stopped before N iterations, e.g., in case the correct value of variable PLLDAC_test is found early (e.g., by checking if the center of the dichotomic range remains the same in two consecutive iterations).

In the UPDN_SEL state 64, as exemplified by the blocks of operations 530 to 534, the FSM 50 carries out a comparison between the variable PLLDAC_test determined at the end of the dichotomic search and the variable PLLDAC_target to determine whether the current value of voltage Vtune is higher or lower than the desired one. At step 530, the FSM 50 checks whether variable PLLDAC_test is lower than variable PLLDAC_target. A positive outcome (Y) of check 530 indicates that the current value of the control voltage Vtune is lower than the desired one, and the FSM 50 transitions to the UP state 65 to compensate for such an undesired decrease of voltage Vtune. In response to a negative outcome (N) of check 530, at step 532 the FSM 50 checks whether variable PLLDAC_test is higher than variable PLLDAC_target. A positive outcome (Y) of check 532 indicates that the current value of the control voltage Vtune is higher than the desired one, and the FSM 50 transitions to the DN state 66 to compensate for such an undesired increase of voltage Vtune. In response to a negative outcome (N) of check 532, at step 534 the FSM 50 checks whether variable PLLDAC_test is equal to variable PLLDAC_target (optional step, because this is the only possibility following two negative outcomes of steps 530 and 532). Once determined that PLLDAC_test is equal to PLLDAC_target, the FSM 50 transitions to the IDLE state 62, because there is no need to actuate a compensation of the control voltage Vtune.

In one or more embodiments, the checks of steps 530, 532 and 534 may include a tolerance. In particular, to prevent small voltage spikes from altering the functioning of the FSM, a parametrized tolerance UPDN_TOLL may be inserted in the comparisons. So, the variable PLLDAC_test may be compared to PLLDAC_target±UPDN_TOLL. The tolerance value may be set via an input signal, e.g., a 4-bit input signal. With respect to the N-bit signal PLLDAC, the value of the tolerance UPDN_TOLL expressed in mV could be calculated according to the following formula:

$$\text{tollerance [mV]} = \frac{\text{UPDN\_TOLL}}{2^{M-1}} * V_{tune\_MAX}$$

When the FSM transitions to the UP state 65, it has thus been determined that voltage Vtune has decreased with respect to the target value and needs to be increased. As exemplified by the blocks of operations 536 to 544, the digital comparison signal PLLDAC is now assigned the value of variable PLLDAC_target, so that initially the detection signal DetCPVLF is equal to zero (because Vtune<PLLDACout). The FSM algorithm gradually (e.g., linearly) decreases the value of the compensation signal VCODAC that acts on the VCO 14 until the control voltage Vtune is increased to the desired value, which is detected when signal DetCPVLF toggles (i.e., switches to 1, in this case). When signal DetCPVLF toggles, the compensation is complete and the FSM transitions again to the IDLE state 62. In particular, at step 536, the digital comparison signal PLLDAC is assigned the value of variable PLLDAC_target. At step 538, it is checked whether the detection signal DetCPVLF is equal to zero (0). In response to a negative outcome (N) of check 538, which indicates that voltage Vtune is still lower than signal PLLDACout, the compensation signal VCODAC is decreased (e.g., by one unit) at step 544, possibly after waiting a certain number of clock cycles as exemplified by the operations of blocks 540 and 542. Indeed, following block 538, the FSM may wait for a certain time interval, as exemplified by the blocks of operations 540 and 542 that substantially implement a timer. In fact, step 540 includes checking whether the third counter CNT_compare (previously initialized to zero) is equal to a certain threshold VCODAC_wait_time. In response to a negative outcome (N) of step 540, the counter CNT_compare is incremented at step 542 (e.g., by one unit). In response to a positive outcome (Y) of step 540, the FSM transitions to step 544. Therefore, substantially, the operations of blocks 540 and 542 provide a timer that pauses the FSM for a number of clock cycles equal to VCODAC_wait_time between two consecutive decrements of the compensation signal VCODAC. In response to a positive outcome (Y) of check 538, the FSM transitions again to the IDLE state 62, insofar as compensation has been accomplished.

On the other hand, when the FSM transitions to the DN state 66, it has been determined that voltage Vtune has increased with respect to the target value and needs to be decreased. As exemplified by the blocks of operations 546 to 554, the digital comparison signal PLLDAC is now assigned the value of variable PLLDAC_target, so that initially the detection signal DetCPVLF is equal to one (because Vtune>PLLDACout). The FSM algorithm gradually (e.g., linearly) increases the value of the compensation signal VCODAC that acts on the VCO 14 until the control voltage Vtune is decreased to the desired value, which is detected when signal DetCPVLF toggles (i.e., switches to 0, in this case). When signal DetCPVLF toggles, the compensation is complete and the FSM transitions again to the IDLE state 62. In particular, at step 546, the digital comparison signal PLLDAC is assigned the value of variable PLLDAC_target. At step 548, it is checked whether the detection signal DetCPVLF is equal to zero (0). In response to a positive outcome (Y) of check 548, which indicates that voltage Vtune is still higher than signal PLLDACout, the compensation signal VCODAC is increased (e.g., by one unit) at step 554, possibly after waiting a certain number of clock cycles as exemplified by the operations of blocks 550 and 552. Indeed, following block 548, the FSM may wait for a certain time interval, as exemplified by the blocks of operations 550 and 552 that substantially implement a timer just like blocks 540 and 542. In response to a negative outcome (N) of check 548, the FSM transitions again to the IDLE state 62, insofar as compensation has been accomplished.

It is noted that waiting between two subsequent updates of the value of the compensation signal VCODAC (see, e.g., blocks 540, 542 and 550, 552) allows for the PLL loop to settle, since the modification of signal VCODAC affects operation of the PLL closed loop.

It is also noted that, while a dichotomic search (and particularly, a binary search) has been described in the above example, different embodiments may rely on a different search algorithm, such as a linear or sequential search algorithm.

It is also noted that, while an FSM with one down-counter (i.e., CNT_idle) and two up-counters (i.e., CNT_halving and CNT_compare) has been described in the above example, other types of counters may be used in different embodiments without departing from the scope of the invention (e.g., all the counters being down-counters or all the counters being up-counters).

One or more embodiments as exemplified herein may thus provide one or more of the following advantages:
  ability of compensating unwanted variations of the control voltage Vtune without resorting to the use of (external) sensors, arrays of capacitors and/or varactors, thereby reducing area occupation and costs and dispensing with sensor calibration procedures; and/or
  ability of compensating unwanted variations of the control voltage Vtune independently from their root cause.

Without prejudice to the underlying principles, the details and embodiments may vary, even significantly, with respect to what has been described by way of example, without departing from the extent of protection.

The extent of protection is determined by the annexed claims.

The invention claimed is:
1. A phase-locked loop (PLL) circuit comprising:
  a voltage-controlled oscillator (VCO) circuit configured to be driven by a control voltage and produce an output periodic signal;
  a comparator circuit configured to:
    compare the control voltage to a comparison signal;
    assert a detection signal in response to the control voltage being higher than the comparison signal; and
    de-assert the detection signal in response to the control voltage being lower than the comparison signal; and
  a digital logic circuit configured to:
    receive the detection signal;
    produce the comparison signal;
    produce a compensation signal for controlling operation of the VCO circuit;

during a first phase of a VCO compensation procedure, determine and store a value of the comparison signal that corresponds to a current value of the control voltage, and compare the stored value of the comparison signal to a target value to determine whether the control voltage should be increased or decreased; and during a second phase of the VCO compensation procedure, iteratively change a value of the compensation signal until the control voltage reaches a desired value.

2. The PLL circuit of claim 1, wherein the comparator circuit is an analog comparator circuit, and wherein the PLL circuit comprises a digital-to-analog converter circuit configured to receive the comparison signal from the digital logic circuit as a digital comparison signal and to convert the digital comparison signal into a corresponding analog comparison signal that is fed to the analog comparator circuit.

3. The PLL circuit of claim 2, wherein, during the first phase of the VCO compensation procedure, the digital logic circuit is configured to:

assign a value of a first variable to the digital comparison signal;

iteratively update the value of the first variable according to a dichotomic search, wherein a direction of each iteration of the dichotomic search is selected as a function of a value of the detection signal; and store a last updated value of the first variable for subsequent comparison to the target value.

4. The PLL circuit of claim 3, wherein the digital logic circuit is configured to wait for an expiration of a first timer between two subsequent updates of the first variable.

5. The PLL circuit of claim 2, wherein, during the second phase of the VCO compensation procedure, the digital logic circuit is configured to:

assign the target value to the digital comparison signal; and gradually change the value of the compensation signal until the detection signal toggles.

6. The PLL circuit of claim 5, wherein the digital logic circuit is configured to:

in response to determining that the control voltage should be increased, gradually decrease the value of the compensation signal until the detection signal toggles to a de-asserted state; and in response to determining that the control voltage should be decreased, gradually increase the value of the compensation signal until the detection signal toggles to an asserted state.

7. The PLL circuit of claim 1, wherein the digital logic circuit is configured to wait for an expiration of a second timer between two subsequent changes of the value of the compensation signal.

8. The PLL circuit of claim 1, wherein the digital logic circuit is configured to wait for an expiration of a third timer between two subsequent executions of the VCO compensation procedure.

9. The PLL circuit of claim 1, wherein the VCO circuit comprises:

a varactor and/or a bank of capacitors controlled by the compensation signal; and a further digital-to-analog converter circuit configured to convert the compensation signal into an analog compensation signal to control the varactor and/or the bank of capacitors.

10. The PLL circuit of claim 1, further comprising:

a phase frequency detector circuit configured to compare a reference periodic signal to a feedback signal produced as a function of the output periodic signal, and produce a phase error signal indicative of a phase error between the reference periodic signal and the feedback signal;

a charge pump circuit configured to receive the phase error signal and produce positive or negative current pulses depending on a polarity of the phase error signal;

a low-pass filter circuit configured to receive the current pulses from the charge pump circuit and produce the control voltage as a function thereof; and a frequency divider circuit configured to receive the output periodic signal and produce the feedback signal by dividing a frequency of the output periodic signal.

11. A method of operating a phase-locked loop (PLL) circuit, the method comprising:

driving a voltage-controlled oscillator (VCO) circuit with a control voltage;

generating, by the VCO circuit, an output periodic signal;

comparing, by a comparator circuit, the control voltage to a comparison signal;

de-asserting, by the comparator circuit, a detection signal in response to the control voltage being lower than the comparison signal;

receiving, by a digital logic circuit, the detection signal;

producing, by the digital logic circuit, the comparison signal;

producing, by the digital logic circuit, a compensation signal for controlling operation of the VCO circuit;

during a first phase of a VCO compensation procedure:
determining and storing, by the digital logic circuit, a value of the comparison signal that corresponds to a current value of the control voltage; and
comparing, by the digital logic circuit, the stored value of the comparison signal to a target value to determine that the control voltage should be increased; and during a second phase of the VCO compensation procedure, iteratively decreasing, by the digital logic circuit, a value of the compensation signal until the control voltage increases to a desired value.

12. The method of claim 11, wherein the comparator circuit is an analog comparator circuit, and the method further comprises:

receiving, by a digital-to-analog converter circuit, the comparison signal from the digital logic circuit as a digital comparison signal; and converting, by the digital-to-analog converter circuit, the digital comparison signal into a corresponding analog comparison signal that is fed to the analog comparator circuit.

13. The method of claim 12, further comprising, during the first phase of the VCO compensation procedure:

assigning, by the digital logic circuit, a value of a first variable to the digital comparison signal;

iteratively updating, by the digital logic circuit, the value of the first variable according to a dichotomic search, wherein a direction of each iteration of the dichotomic search is selected as a function of a value of the detection signal; and storing, by the digital logic circuit, a last updated value of the first variable for subsequent comparison to the target value.

14. The method of claim 12, further comprising, during the second phase of the VCO compensation procedure:
 assigning, by the digital logic circuit, the target value to the digital comparison signal; and
 gradually decreasing, by the digital logic circuit, the value of the compensation signal until the detection signal toggles to a de-asserted state.

15. The method of claim 11, further comprising:
 comparing, by a phase frequency detector circuit, a reference periodic signal to a feedback signal produced as a function of the output periodic signal;
 producing, by the phase frequency detector circuit, a phase error signal indicative of a phase error between the reference periodic signal and the feedback signal;
 receiving, by a charge pump circuit, the phase error signal;
 producing, by the charge pump circuit, positive or negative current pulses depending on a polarity of the phase error signal;
 receiving, by a low-pass filter circuit, the current pulses from the charge pump circuit;
 producing, by the low-pass filter circuit, the control voltage as a function thereof;
 receiving, by a frequency divider circuit, the output periodic signal; and
 producing, by the frequency divider circuit, the feedback signal by dividing a frequency of the output periodic signal.

16. A method of operating a phase-locked loop (PLL) circuit, the method comprising:
 driving a voltage-controlled oscillator (VCO) circuit with a control voltage;
 generating, by the VCO circuit, an output periodic signal;
 comparing, by a comparator circuit, the control voltage to a comparison signal;
 asserting, by the comparator circuit, a detection signal in response to the control voltage being higher than the comparison signal;
 receiving, by a digital logic circuit, the detection signal;
 producing, by the digital logic circuit, the comparison signal;
 producing, by the digital logic circuit, a compensation signal for controlling operation of the VCO circuit;
 during a first phase of a VCO compensation procedure:
  determining and storing, by the digital logic circuit, a value of the comparison signal that corresponds to a current value of the control voltage; and
  comparing, by the digital logic circuit, the stored value of the comparison signal to a target value to determine that the control voltage should be decreased; and
 during a second phase of the VCO compensation procedure, iteratively increasing, by the digital logic circuit, a value of the compensation signal until the control voltage decreases to a desired value.

17. The method of claim 16, wherein the comparator circuit is an analog comparator circuit, and the method further comprises:
 receiving, by a digital-to-analog converter circuit, the comparison signal from the digital logic circuit as a digital comparison signal; and
 converting, by the digital-to-analog converter circuit, the digital comparison signal into a corresponding analog comparison signal that is fed to the analog comparator circuit.

18. The method of claim 17, further comprising, during the first phase of the VCO compensation procedure:
 assigning, by the digital logic circuit, a value of a first variable to the digital comparison signal;
 iteratively updating, by the digital logic circuit, the value of the first variable according to a dichotomic search, wherein a direction of each iteration of the dichotomic search is selected as a function of a value of the detection signal; and
 storing, by the digital logic circuit, a last updated value of the first variable for subsequent comparison to the target value.

19. The method of claim 17, further comprising, during the second phase of the VCO compensation procedure:
 assigning, by the digital logic circuit, the target value to the digital comparison signal; and
 gradually increasing, by the digital logic circuit, the value of the compensation signal until the detection signal toggles to an asserted state.

20. The method of claim 16, further comprising:
 comparing, by a phase frequency detector circuit, a reference periodic signal to a feedback signal produced as a function of the output periodic signal;
 producing, by the phase frequency detector circuit, a phase error signal indicative of a phase error between the reference periodic signal and the feedback signal;
 receiving, by a charge pump circuit, the phase error signal;
 producing, by the charge pump circuit, positive or negative current pulses depending on a polarity of the phase error signal;
 receiving, by a low-pass filter circuit, the current pulses from the charge pump circuit;
 producing, by the low-pass filter circuit, the control voltage as a function thereof;
 receiving, by a frequency divider circuit, the output periodic signal; and
 producing, by the frequency divider circuit, the feedback signal by dividing a frequency of the output periodic signal.

* * * * *